US012796233B2

(12) United States Patent
Cheon et al.

(10) Patent No.: US 12,796,233 B2
(45) Date of Patent: Nov. 10, 2026

(54) DISPLAY DEVICE AND MANUFACTURING METHOD THEREOF

(71) Applicant: Samsung Display Co., LTD., Yongin-si (KR)

(72) Inventors: Soo Hong Cheon, Yongin-si (KR); Kyung Ho Park, Yongin-si (KR); Seung Soo Baek, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 391 days.

(21) Appl. No.: 18/627,139

(22) Filed: Apr. 4, 2024

(65) Prior Publication Data

US 2024/0407197 A1 Dec. 5, 2024

(30) Foreign Application Priority Data

Jun. 2, 2023 (KR) ........................ 10-2023-0071261

(51) Int. Cl.
*H10K 59/122* (2023.01)
*H10K 59/12* (2023.01)
*H10K 71/16* (2023.01)

(52) U.S. Cl.
CPC ....... *H10K 59/122* (2023.02); *H10K 59/1201* (2023.02); *H10K 71/166* (2023.02)

(58) Field of Classification Search
CPC ............. H10K 59/122; H10K 59/1201; H10K 71/166; H10K 59/805; C23C 14/042
USPC ........................................................... 257/40
See application file for complete search history.

(56) References Cited

U.S. PATENT DOCUMENTS

| | | | |
|---|---|---|---|
| 6,847,429 B2 | 1/2005 | Cho | |
| 8,269,414 B2 | 9/2012 | Jeon et al. | |
| 8,625,043 B2 | 1/2014 | Hwang et al. | |
| 8,674,596 B2 | 3/2014 | Kim et al. | |
| 2017/0141352 A1* | 5/2017 | Shin | G02F 1/133345 |

FOREIGN PATENT DOCUMENTS

| | | |
|---|---|---|
| KR | 10-0757488 | 9/2007 |
| KR | 10-0833772 | 5/2008 |
| KR | 10-0833773 | 5/2008 |
| KR | 10-0873704 | 12/2008 |
| KR | 10-1777307 | 9/2017 |
| KR | 10-2177784 | 11/2020 |
| KR | 10-2022-0063136 | 5/2022 |

* cited by examiner

*Primary Examiner* — Tong-Ho Kim

(57) ABSTRACT

A manufacturing method of a display device includes forming a mask support spaced apart from an edge of a substrate by a first distance, disposing a mask including a transmissive area and a non-transmissive area surrounding the transmissive area on the mask support, determining a display area and a peripheral area positioned at a side of the display area based on at least one of a size of the display area and a width of the non-transmissive area, and forming a light emitting layer in the display area corresponding to the transmissive area and a portion of the peripheral area using the mask.

19 Claims, 15 Drawing Sheets

DISPLAY DEVICE AND MANUFACTURING METHOD THEREOF

CROSS-REFERENCE TO RELATED APPLICATION(S)

The application claims priority to and benefits of Korean Patent Application No. 10-2023-0071261 under 35 U.S.C. § 11, filed Jun. 2, 2023, in the Korean Intellectual Property Office (KIPO), the entire contents of which are incorporated herein by reference.

BACKGROUND

1. Technical Field

The disclosure relates to a display device and a manufacturing method thereof.

2. Discussion of Related Art

An organic light emitting diode (OLED) is an active type light emitting display element. The organic light emitting diode has advantages such as a wide viewing angle, excellent contrast ratio, low voltage operation, light weight, thin shape, and fast response speed. Therefore, the organic light emitting diode is attracting attention as a next-generation display element.

In the organic light emitting diode, organic layers and/or electrodes may be formed by a vacuum deposition method. In such a deposition process, a mask may be used, and a position at which the mask is supported may vary depending on process conditions of a display device, such as the number of pixels and resolution.

SUMMARY

An object of the disclosure is to provide a display device capable of sharing masks used in a manufacturing process of the display device and a manufacturing method thereof.

However, objects of the disclosure are not limited to the above-described object, and may be variously extended without departing from the spirit and scope of the disclosure.

A manufacturing method of a display device according to embodiments of the disclosure may include forming a mask support spaced apart from an edge of a substrate by a first distance, disposing a mask including a transmissive area and a non-transmissive area surrounding the transmissive area on the mask support, determining a display area and a peripheral area positioned at a side of the display area based on at least one of a size of the display area and a width of the non-transmissive area, and forming a light emitting layer in the display area corresponding to the transmissive area and a portion of the peripheral area using the mask.

According to an embodiment, in a plan view, the peripheral area of the substrate may include a first area overlapping the non-transmissive area and a second area overlapping the transmissive area, and the light emitting layer may be not formed in the first area.

According to an embodiment, in the determining of the display area and the peripheral area, the second area of the peripheral area may be set smaller as the width of the non-transmissive area increases.

According to an embodiment, in the determining of the display area and the peripheral area, a size of the second area of the peripheral area may be set smaller as the size of the display area increases.

According to an embodiment, in the determining of the display area and the peripheral area, the size of the display area and the second area of the peripheral area may be in inverse proportion to each other.

According to an embodiment, the first area of the peripheral area may be determined based on the width of the non-transmissive area of the mask.

According to an embodiment, the first area of the peripheral area may have a fixed size regardless of the size of the display area.

According to an embodiment, in a plan view, the mask support may overlap the first area of the peripheral area.

According to an embodiment, the forming of the mask support may include forming a first dam structure spaced apart from the edge of the substrate by the first distance and protruding in a direction.

According to an embodiment, the forming of the first dam structure may include forming a via layer and a pixel defining layer in the peripheral area, and forming the first dam structure by removing portions of the via layer and the pixel defining layer.

According to an embodiment, the manufacturing method may further include forming a second dam structure spaced apart from the first dam structure in a first direction by removing another portions of the via layer and the pixel defining layer.

According to an embodiment, in a plan view, the first dam structure and the second dam structure may overlap the first area of the peripheral area.

According to an embodiment, the manufacturing method may further include forming an insulating layer covering the first dam structure and the second dam structure.

According to an embodiment, in a plan view, the peripheral area may include a first area overlapping the non-transmissive area and a second area overlapping the transmissive area. In a plan view, the second area of the peripheral area may not overlap the non-transmissive area, and the first area of the peripheral area may not overlap the transmissive area.

According to an embodiment, the mask support may be disposed spaced apart from the substrate by the first distance within the peripheral area regardless of the size of the display area.

A display device according to embodiments of the disclosure may include a substrate including a display area including a light emitting element and a peripheral area positioned on a side of the display area, a mask support disposed on the substrate spaced apart from the substrate by a first distance in the peripheral area, a via layer disposed on the substrate spaced apart from the mask support, and a first electrode, a light emitting layer, and a second electrode sequentially disposed on the via layer in a direction in portions of the display area and the peripheral area. The first electrode and the second electrode disposed in the display area may directly contact the light emitting layer, a pixel defining layer may be disposed between the first electrode and the light emitting layer disposed in the peripheral area, and the display area and the peripheral area may be determined based on a size of the display area and a width of the light emitting layer.

According to an embodiment, the peripheral area may include a first area where the light emitting layer is not disposed and a second area where the light emitting layer is disposed, and the size of the display area and a size of the second area of the peripheral area may be in inverse proportion to each other.

According to an embodiment, the mask support may be disposed spaced apart from the substrate by the first distance within the first area regardless of the size of the display area.

According to an embodiment, the mask support may have a dam structure protruding in the direction.

DETAILED DESCRIPTION OF THE EMBODIMENTS

Figure 1:
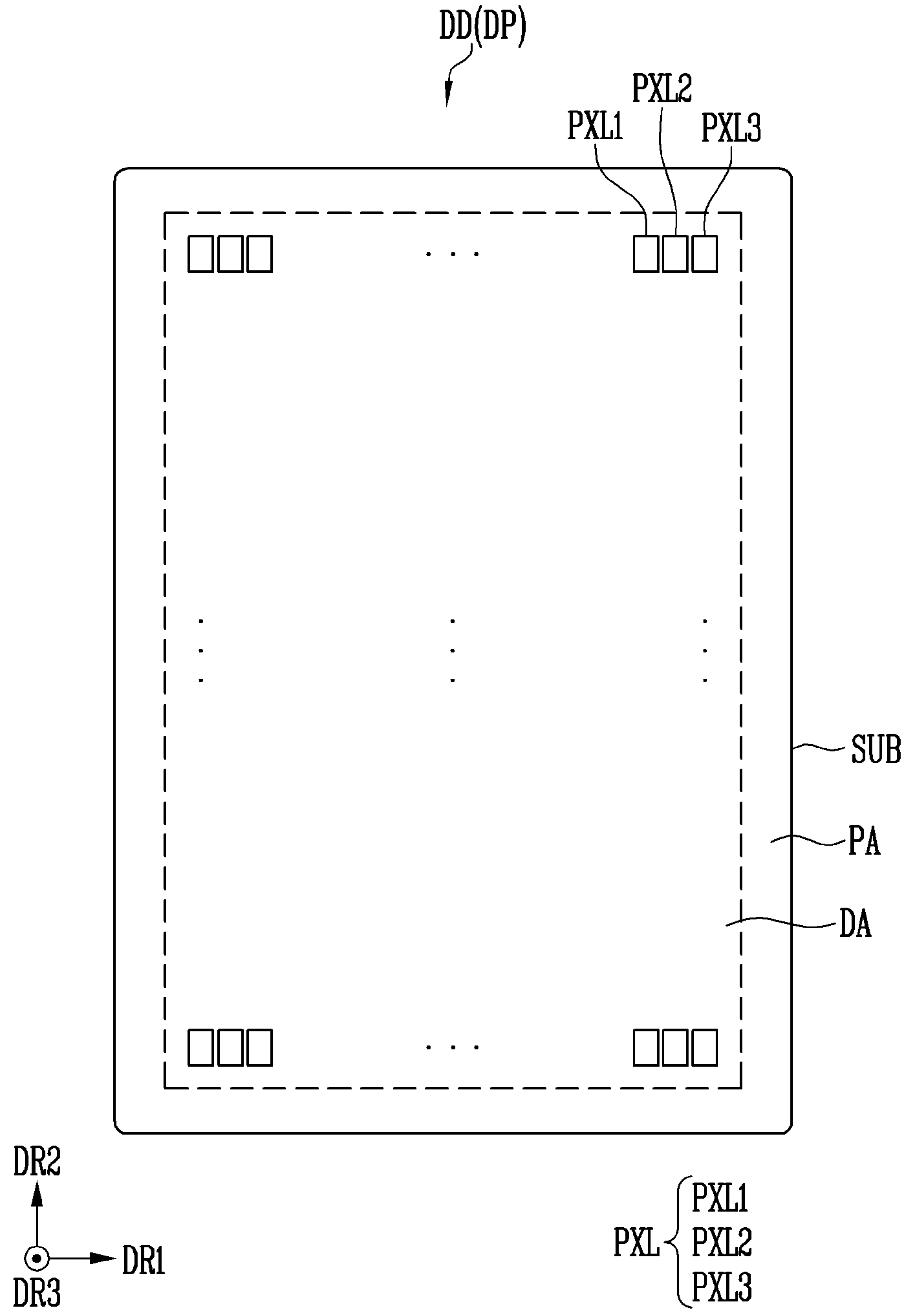
FIG. 1 is a plan view schematically illustrating a display device according to embodiments of the disclosure.

Hereinafter, embodiments of the disclosure will be described in more detail with reference to the accompanying drawings. The same reference numerals are used for the same elements in the drawings, and duplicate descriptions of the same elements are omitted.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a plan view schematically illustrating a display device according to embodiments of the disclosure.

Referring to FIG. 1, a display panel DP (or display device DD) according to an embodiment may be provided in various shapes. For example, the display panel DP may be provided in a rectangular plate shape having two pairs of sides parallel to each other in a plan view, but the disclosure is not limited thereto. In case that the display panel DP is provided in a rectangular plate shape, a pair of sides among the two pairs of sides may be longer than another pair of sides.

At least a portion of the display panel DP may have flexibility and may be folded in a portion having flexibility, but the disclosure is not limited thereto.

The display panel DP may display an image. As the display panel DP, a display panel capable of self-emitting light, such as an organic light emitting display panel (OLED panel) using an organic light emitting diode as a light emitting element, a micro-LED or nano-LED display panel using a micro-light emitting diode as a light emitting element, or a quantum dot organic light emitting display panel (QD OLED panel) using quantum dots and organic light emitting diodes, may be used. As the display panel DP, a display panel that does not emit light, such as a liquid crystal display panel (LCD panel), an electro-phoretic display panel (EPD panel), or an electro-wetting display panel (EWD panel), may be used. In case that a display panel that does not emit light is used as the display panel DP, the display device DD may include a light emitting device that supplies light to the display panel DP.

The display panel DP may include a substrate SUB and pixels PXL provided on the substrate SUB.

The substrate SUB may include a transparent insulating material through which light may be transmitted. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate including a polymeric organic material and a plastic substrate. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The display device DD may have various shapes. For example, the display device DD may be provided in a rectangular shape in a plan view, but the disclosure is not limited thereto. For example, the display device DD may have a circular or elliptical shape. Also, the display device DD may include angled corners and/or curved corners. For convenience of description, FIG. 1 shows the display device DD having a rectangular plate shape as an embodiment. In FIG. 1, a direction (for example, a horizontal direction) in which the short side of the display device DD extends is indicated as a first direction DR1, and a direction (for example, a vertical direction) in which the long side extends is indicated as a second direction DR2, but the disclosure is not limited thereto.

The substrate SUB (and the display device DD) may include a display area DA for displaying an image and a peripheral area PA (or a non-display area) other than the display area DA. The substrate SUB may include the display area DA including pixel areas where each pixel PXL is disposed and the peripheral area PA disposed adjacent to (for example, around) the display area DA.

The peripheral area PA may be positioned adjacent to the display area DA. The peripheral area PA may be provided on at least one side of the display area DA. For example, the peripheral area PA may surround the periphery (or edge) of the display area DA. For example, the peripheral area PA may be a non-display area and may be referred to as a bezel area of the display device DD.

The pixels PXL may be disposed in the display area DA of the substrate SUB. The peripheral area PA may be disposed adjacent to (e.g., around) the display area DA. The peripheral area PA may have a structure for protecting components included in the pixels PXL disposed in the display area DA, but the disclosure is not limited thereto. For example, a wiring unit connected to each pixel PXL and a driving unit connected to the wiring unit and driving the pixel PXL may be provided in the peripheral area PA.

The pixel PXL may include multiple pixels. In an embodiment, the pixel PXL may include a first pixel PXL1, a second pixel PXL2, and a third pixel PXL3. The first pixel PXL1, the second pixel PXL2, and the third pixel PXL3 may be sequentially arranged in the first direction DR1. However, the disclosure is not limited thereto, and the first pixel PXL1, the second pixel PXL2, and the third pixel PXL3 may be sequentially disposed in the second direction DR2 intersecting the first direction DR1.

The first, second, and third pixels PXL1, PXL2, and PXL3 may emit light of different colors. In an embodiment, the first pixel PXL1 may be a red sub-pixel emitting red light, the second pixel PXL2 may be a green sub-pixel emitting green light, and the third pixel PXL3 may be a blue sub-pixel emitting blue light. However, the color, type, and/or number of pixels constituting the pixel PXL are not particularly limited. For example, the color of light emitted from each of the first to third pixels PXL1 to PXL3 may be variously changed.

Hereinafter, when the first to third pixels PXL1 to PXL3 are comprehensively referred to, the first to third pixels PXL1 to PXL3 may be referred to as pixel PXL.

Multiple pixels PXL may be provided, and may be arranged in a matrix form along rows extending in the first direction DR1 and columns extending in the second direction DR2. The arrangement of the pixels PXL is not particularly limited. In case that multiple pixels PXL are provided, multiple pixels PXL may be provided to have different areas (or sizes). For example, in a case of the pixels PXL having different colors of light emitted, the pixels PXL may be provided in different areas (or sizes) or different shapes for each color in a plan view.

The driving unit may control driving of the pixels PXL by providing a signal and a power to each pixel PXL through the wiring unit.

Figure 2:
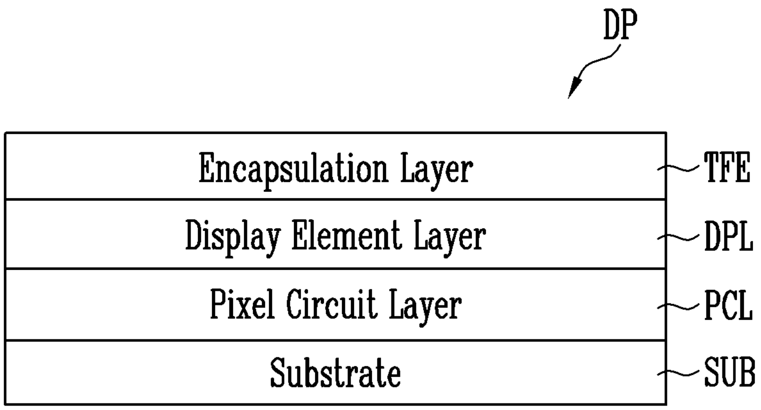
FIG. 2 is a schematic cross-sectional view illustrating a display panel of FIG. 1.

FIG. 2 is a schematic cross-sectional view illustrating a display panel of FIG. 1.

The display panel DP (or each of the pixels PXL) may include a pixel circuit layer PCL, a display element layer DPL, and an encapsulation layer TFE disposed on the substrate SUB.

The pixel circuit layer PCL may be provided on the substrate SUB and may include multiple transistors and signal lines connected to the transistors. For example, each transistor may have a form in which a semiconductor pattern, a gate electrode, a source electrode, and a drain electrode are sequentially stacked with insulating layers interposed between the semiconductor pattern, the gate electrode, the source electrode, and the drain electrode. The semiconductor pattern may include amorphous silicon, poly silicon, low temperature poly silicon, an organic semiconductor, and/or an oxide semiconductor. The gate electrode, the source electrode, and the drain electrode may include at least one of aluminum (Al), copper (Cu), titanium (Ti), and molybdenum (Mo), but the disclosure is not limited thereto. Also, the pixel circuit layer PCL may include one or more insulating layers.

The display element layer DPL may be disposed on the pixel circuit layer PCL. The display element layer DPL may include a light emitting element emitting light. The light emitting element may be, for example, an organic light emitting diode, but the disclosure is not limited thereto. According to an embodiment, the light emitting element may be an inorganic light emitting element including an inorganic light emitting material or a light emitting element that emits light by changing a wavelength of light emitted using quantum dots.

The encapsulation layer TFE may be disposed on the display element layer DPL. The encapsulation layer TFE may be an encapsulation substrate or an encapsulation film made of a multilayer film. In case that the encapsulation layer TFE is an encapsulation film, the encapsulation layer TFE may include an inorganic film and/or an organic film. For example, the encapsulation layer TFE may include an inorganic layer, an organic layer, and an inorganic layer sequentially stacked. The encapsulation layer TFE may prevent air and moisture from penetrating into the display element layer DPL and the pixel circuit layer PCL from outside.

Figure 3:
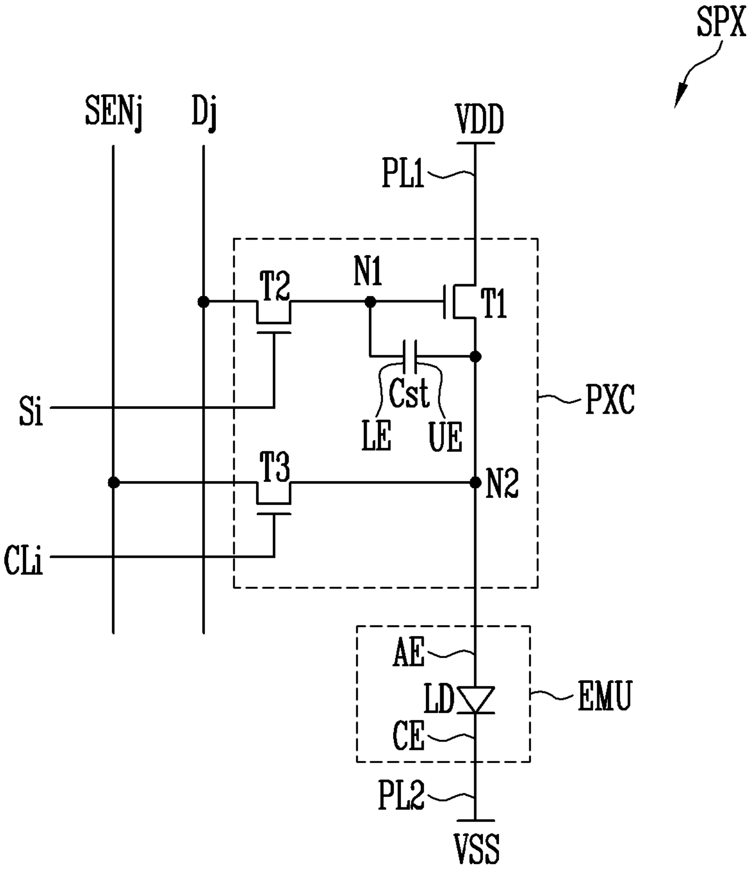
FIG. 3 is a schematic of an equivalent circuit of a pixel included in the display device of FIG. 1 according to an embodiment.

FIG. 3 is a schematic diagram of an equivalent circuit of a pixel included in the display device of FIG. 1 according to an embodiment.

For convenience of description, FIG. 3 shows a pixel PXL positioned in an i-th pixel row (or an i-th horizontal line) and a j-th pixel column as an embodiment, where i and j may be natural numbers.

Referring to FIGS. 1 to 3, the pixel PXL may include an emission unit EMU that generates light having a luminance corresponding to a data signal. Also, the pixel PXL may further include a pixel circuit PXC for driving the emission unit EMU.

The emission unit EMU may include a light emitting element LD connected between a first power source line PL1 receiving a voltage of a first driving power source VDD (or first power source) and a second power source line PL2 receiving a voltage of a second driving power source VSS (or second power source). In an embodiment, the emission unit EMU may include the light emitting element LD including a first electrode AE connected to the first driving power source VDD via the pixel circuit PXC and the first power source line PL1 and a second electrode CE connected to the second driving power source VSS via the second power source line PL2. The first electrode AE may be an anode, and the second electrode CE may be a cathode. The first driving power source VDD and the second driving power source VSS may have different potentials, and a potential difference between the first and second driving power sources VDD and VSS may be set to be higher than or equal to a threshold voltage of the light emitting element LD during an emission period of the pixel PXL.

In case that the pixel PXL is positioned in the i-th pixel row and the j-th pixel column in the display area DA, the pixel circuit PXC of the pixel PXL (or sub-pixel) may be electrically connected to an i-th scan line Si and a j-th data line Dj. Also, the pixel circuit PXC may be electrically connected to an i-th control line CLi and a j-th sensing line SENj.

The pixel circuit PXC may include first to third transistors T1, T2, and T3 and a storage capacitor Cst.

The first transistor T1 may be a driving transistor for controlling a driving current applied to the light emitting element LD, and may be electrically connected between the first driving power source VDD and the light emitting element LD. For example, a first terminal of the first transistor T1 may be electrically connected to the first driving power source VDD through the first power source line PL1, a second terminal of the first transistor T1 may be electrically connected to a second node N2, and a gate electrode of the first transistor T1 may be electrically connected to a first node N1. The first transistor T1 may control an amount of driving current applied from the first driving power source VDD to the light emitting element LD through the second node N2 according to a voltage applied to the first node N1. In an embodiment, the first terminal of the first transistor T1 may be a drain electrode, and the second terminal of the first transistor T1 may be a source electrode, but the disclosure is not limited thereto. In another embodiment, the first terminal may be a source electrode and the second terminal may be a drain electrode.

The second transistor T2 may be a switching transistor that selects the pixel PXL in response to a scan signal and activates the pixel PXL, and may be electrically connected between a data line Dj (for example, the j-th data line) and the first node N1. A first terminal of the second transistor T2 may be electrically connected to the data line Dj, a second terminal of the second transistor T2 may be connected to the first node N1 (or the gate electrode of the first transistor T1), and a gate electrode of the second transistor T2 may be electrically connected to a scan line Si (or the i-th scan line). The first terminal and the second terminal of the second transistor T2 may be different terminals. For example, in case that the first terminal is a drain electrode, the second terminal may be a source electrode.

The second transistor T2 may be turned on in case that a scan signal of a gate-on voltage (for example, a high level voltage) is supplied from the scan line Si to electrically connect the data line Dj and the first node N1. The first node N1 may be a point where the second terminal of the second transistor T2 and the gate electrode of the first transistor T1 are connected to each other, and the second transistor T2 may transfer a data signal to the gate electrode of the first transistor T1.

The third transistor T3 may obtain a sensing signal through a sensing line SENj (for example, the j-th sensing line) by electrically connecting the first transistor T1 to the sensing line SENj, and detect characteristics of the pixel PXL including a threshold voltage of the first transistor T1 by using the sensing signal. Information on the characteristics of the pixel PXL may be used to convert image data so that deviation in characteristics between the pixels PXL can be compensated for. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to a control line CLi (for example, the i-th control line). The first terminal may be a drain electrode, and the second terminal may be a source electrode.

The third transistor T3 may be an initialization transistor capable of initializing the second node N2. The third transistor T3 may be turned on in case that a sensing control signal is supplied from the control line CLi to transfer a voltage of an initialization power source to the second node N2. Accordingly, the storage capacitor Cst electrically connected to the second node N2 may be initialized.

The storage capacitor Cst may include a lower electrode LE (or first storage electrode) and an upper electrode UE (or second storage electrode). The lower electrode LE may be electrically connected to the first node N1 and the upper electrode UE may be electrically connected to the second node N2. The storage capacitor Cst may be charged with a data voltage corresponding to the data signal supplied to the first node N1 during one frame period. Accordingly, the storage capacitor Cst may store a voltage corresponding to a difference between a voltage of the gate electrode of the first transistor T1 and a voltage of the second node N2.

FIG. 3 schematically shows an embodiment in which all of the first to third transistors T1, T2, and T3 are N-type transistors, but the disclosure is not limited thereto. For example, at least one of the first to third transistors T1, T2, and T3 may be changed to a P-type transistor. The structure of the pixel circuit PXC may be variously changed and implemented.

In the following embodiments, for convenience of description, a horizontal direction (X-axis direction) in a plan view is indicated as the first direction DR1, a vertical direction (Y-axis direction) in a plan view is indicated as the second direction DR2, and a vertical direction in a cross sectional view is indicated as a third direction DR3.

Figure 4:
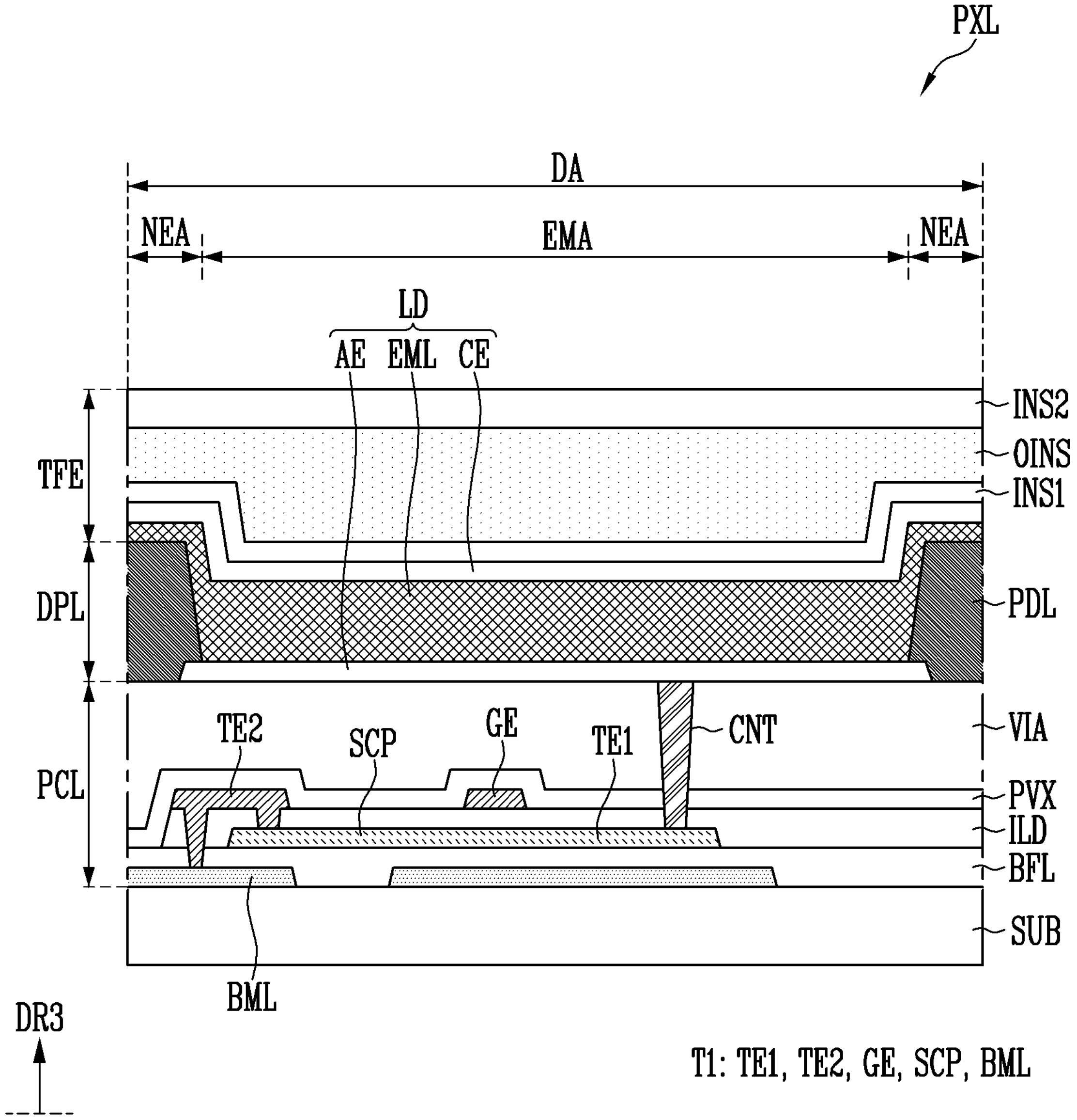
FIG. 4 is a schematic cross-sectional view illustrating a display area of the display device including a light emitting element of FIG. 3.

FIG. 4 is a schematic cross-sectional view illustrating a display area of the display device including a light emitting element of FIG. 3.

Referring to FIG. 4, each electrode is shown as a single film electrode and each insulating layer is shown as a single film insulating layer. As such, although the stacked structure of the pixel PXL is schematically illustrated, but the disclosure is not limited thereto.

The pixel PXL shown in FIG. 4 may be one of the first, second, and third pixels PXL1, PXL2, and PXL3 shown in FIG. 1, and may be equally applied to other pixels.

The pixel PXL may be disposed in the display area DA. The pixel PXL may include an emission area EMA and a non-emission area NEA. The pixel PXL may include the substrate SUB, the pixel circuit layer PCL, the display element layer DPL, and the encapsulation layer TFE.

The substrate SUB may include a transparent insulating material through which light may be transmitted. The substrate SUB may be a rigid substrate or a flexible substrate.

Circuit elements (for example, the first to third transistors T1, T2, and T3 of FIG. 3) and signal lines electrically connected to the circuit elements may be disposed in the pixel circuit layer PCL. The light emitting element LD electrically connected to each of the circuit elements may be disposed in the display element layer DPL.

The pixel circuit layer PCL may be disposed on the substrate SUB. The pixel circuit layer PCL may include a lower auxiliary electrode BML, a buffer layer BFL, a first transistor T1, an interlayer insulating layer ILD, a passivation layer PVX, and a via layer VIA. FIG. 4 shows only the first transistor T1 among the circuit elements for convenience of description.

The lower auxiliary electrode BML may be disposed on the substrate SUB. The lower auxiliary electrode BML may function as a path through which electrical signals move. In an embodiment, the lower auxiliary electrode BML may overlap the first transistor T1 in a plan view.

The buffer layer BFL may be disposed on the substrate SUB. The buffer layer BFL may cover the lower auxiliary electrode BML. The buffer layer BFL may prevent impurities from diffusing from outside. The buffer layer BFL may prevent impurities from diffusing into the first transistor T1 provided on the substrate SUB and improve flatness of the substrate SUB. The buffer layer BFL may be provided as a single layer or may be provided as multiple layers. The buffer layer BFL may be an inorganic insulating layer including an inorganic material. The inorganic insulating layer may include, for example, at least one of silicon nitride ($SiN_x$), silicon oxide ($SiO_x$), silicon oxynitride (SiON), and a metal oxide such as aluminum oxide ($AlO_x$). In case that the buffer layer BFL is provided in multiple layers, each layer may be formed of a same material or different materials. The buffer layer BFL may be omitted in an embodiment.

The first transistor T1 may include a semiconductor pattern SCP, a gate electrode GE, a first terminal TE1, and a second terminal TE2. The first terminal TE1 may be one of a source electrode and a drain electrode, and the second terminal TE2 may be another one of a source electrode and a drain electrode. For example, in case that the first terminal TE1 is a drain electrode, the second terminal TE2 may be a source electrode.

The semiconductor pattern SCP may be provided and/or formed on the buffer layer BFL. The semiconductor pattern SCP may include a first contact region contacting the first terminal TE1, a second contact region contacting the second terminal TE2, and a channel region between the first contact region and the second contact region. The channel region may overlap the gate electrode GE of the first transistor T1 in a plan view. The semiconductor pattern SCP may be a semiconductor pattern made of amorphous silicon, polysilicon, low-temperature polysilicon, an oxide semiconductor, an organic semiconductor, or the like. The channel region may be, for example, a semiconductor pattern not doped with impurities, and may be an intrinsic semiconductor. The first contact region and the second contact region may be semiconductor patterns doped with impurities. In an embodiment, the first terminal TE1 may be electrically connected to the light emitting element LD through a separate connection means such as a bridge electrode.

The interlayer insulating layer ILD may be provided and/or formed on the semiconductor pattern SCP. The interlayer insulating layer ILD may be an inorganic insulating layer including an inorganic material. The interlayer insulating layer ILD and the buffer layer BFL may include a same material, or the interlayer insulating layer ILD may include a material that can constitute the buffer layer BFL. In an embodiment, the interlayer insulating layer ILD may be provided as an organic insulating layer including an organic material. The interlayer insulating layer ILD may be provided as a single layer or multiple layers of at least two or more layers.

The gate electrode GE may be provided and/or formed on the interlayer insulating layer ILD to correspond to the channel region of the semiconductor pattern SCP. The gate electrode GE may be provided on the interlayer insulating layer ILD and overlap the channel region of the semiconductor pattern SCP in a plan view. The gate electrode GE may be formed of a single layer including at least one of copper (Cu), molybdenum (Mo), tungsten (W), aluminum neodymium (AlNd), titanium (Ti), aluminum (Al), silver (Ag), and an alloy thereof. In another embodiment, the gate electrode GE may be formed of a double or multi-layer structure made of molybdenum (Mo), titanium (Ti), copper (Cu), aluminum (Al), or silver (Ag), which is a low-resistance material, to reduce wiring resistance.

The second terminal TE2 may be provided and/or formed on the interlayer insulating layer ILD and contact the second contact region of the semiconductor pattern SCP through a contact hole penetrating the interlayer insulating layer ILD. The second terminal TE2 may contact the lower auxiliary electrode BML through a contact hole penetrating the interlayer insulating layer ILD and the buffer layer BFL. The first terminal TE1, the second terminal TE2, and the gate electrode GE may include a same material, or the first terminal TE1 and the second terminal TE2 may include a material that can constitute the gate electrode GE.

In the above-described embodiment, the first terminal TE1 of the first transistor T1 may be disposed in a region adjacent to the channel region of the semiconductor pattern SCP, and the second terminal TE2 may be electrically connected to the semiconductor pattern SCP through a contact hole penetrating the interlayer insulating layer ILD, but the disclosure is not limited thereto. According to an embodiment, the first terminal TE1 may be electrically connected to the semiconductor pattern SCP through a contact hole penetrating the interlayer insulating layer ILD, and the second terminal TE2 may be disposed in a region adjacent to the channel region of the semiconductor pattern SCP.

The passivation layer PVX may be provided and/or formed on the first transistor T1. The passivation layer PVX may be provided in a form including an inorganic insulating layer disposed on an organic insulating layer or an organic insulating layer disposed on an inorganic insulating layer. The inorganic insulating layer may include, for example, at least one of silicon oxide ($SiO_x$), silicon nitride ($SiN_x$), silicon oxynitride ($SiO_xN_y$), and a metal oxide such as aluminum oxide ($AlO_x$). The organic insulating layer may include, for example, at least one of an acrylic resin (polyacrylate resin), an epoxy resin, a phenol resin, a polyamide resin, a polyimide resin, an unsaturated polyester resin, a poly-phenylen ethers resin, a poly-phenylene sulfide resin, and a benzocyclobutene resin.

The via layer VIA may be provided and/or formed entirely on the passivation layer PVX. The via layer VIA may be an inorganic insulating layer including an inorganic material or an organic insulating layer including an organic material.

Each of the interlayer insulating layer ILD, the passivation layer PVX, and the via layer VIA may be partially opened to include a contact portion CNT (or a contact hole). The first terminal TE1 may be electrically connected to the light emitting element LD through the contact portion CNT.

The display element layer DPL may be provided and/or formed on the via layer VIA. The display element layer DPL may include the light emitting element LD and a pixel defining layer PDL.

The light emitting element LD may include the first electrode AE, a light emitting layer EML, and the second electrode CE. The light emitting element LD may be electrically connected to a pixel circuit (for example, the pixel circuit PXC of FIG. 3) of a corresponding pixel.

The first electrode AE may be provided and/or formed on the via layer VIA of a corresponding pixel. The first electrode AE may be an anode electrode of the light emitting element LD.

The first electrode AE may be electrically connected to the first terminal TE1 through the corresponding contact portion CNT.

The first electrode AE may be made of a conductive material. The conductive material may include an opaque metal. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the first electrode AE is not limited to the above-described embodiment. According to an embodiment, the first electrode AE may include a transparent conductive material. The transparent conductive material may include a conductive oxide such as indium tin oxide (ITO), indium zinc oxide (IZO), zinc oxide ($ZnO_x$), indium gallium zinc oxide (IGZO), indium tin zinc oxide (ITZO), a conductive polymer such as poly(3,4-ethylenedioxythiophene) (PEDOT), or the like. In case that the first electrode AE includes a transparent conductive material, a separate conductive layer made of an opaque metal may be added so that light emitted from the light emitting layer EML is reflected in an image display direction (or the encapsulation layer TFE) of a display device (for example, the display device DD of FIG. 1).

The first electrode AE may be positioned in the emission area EMA.

The pixel defining layer PDL may define (or partition) the emission area EMA. The pixel defining layer PDL may be an organic insulating layer made of an organic material. In an embodiment, the pixel defining layer PDL may include a light absorbing material or may be coated with a light absorbing material to absorb light introduced from outside. For example, the pixel defining layer PDL may include a carbon-based black pigment. However, the disclosure is not limited thereto.

The pixel defining layer PDL may be partially opened to include an opening (not shown) exposing a region of the first electrode AE, and may protrude from the via layer VIA along the circumference of the emission area EMA in the third direction DR3. The pixel defining layer PDL may be disposed on the via layer VIA and define a region where the light emitting layer EML contacts the first electrode AE. The light emitting layer EML may be disposed on the first electrode AE exposed by the opening of the pixel defining layer PDL.

The light emitting layer EML may be positioned above the first electrode AE and above the pixel defining layer PDL within the opening of the pixel defining layer PDL, but the disclosure is not limited thereto. The light emitting layer EML may be positioned only above the first electrode AE within the opening of the pixel defining layer PDL.

The light emitting layer EML may have a multilayer thin film structure including a light generation layer that generates light. The light emitting layer EML may emit one of red light, green light, and blue light, but the disclosure is not limited thereto. The light emitting layer EML may have a multilayer thin film structure including a light generation layer. The light emitting layer EML may include a hole injection layer for injecting holes, a hole transport layer having excellent hole transport properties and suppressing the movement of electrons that are not combined in the light generation layer to increase the chance of recombination of holes and electrons, the light generation layer that emits light by recombination of injected electrons and holes, a hole blocking layer for suppressing the movement of holes that are not combined in the light generation layer, an electron transport layer for readily transporting electrons to the light generation layer, and an electron injection layer for injecting electrons. The light emitting layer EML may emit light based on electrical signals provided from the first electrode AE and the second electrode CE.

The second electrode CE may be disposed on the light emitting layer EML and the pixel defining layer PDL. The second electrode CE may be provided in a plate shape over an entire area of the display area DA.

The second electrode CE may be a thin metal layer having a thickness sufficient to transmit light emitted from the light emitting layer EML. The second electrode CE may be formed of a metal material or a transparent conductive material and have a relatively thin thickness. The second electrode CE may include at least one of various transparent conductive materials including indium tin oxide, indium zinc oxide, indium tin zinc oxide, aluminum zinc oxide, gallium zinc oxide, zinc tin oxide, or gallium tin oxide, and may be implemented as substantially transparent or translucent to satisfy a light transmittance (e.g., predetermined light transmittance). Accordingly, light emitted from the light emitting layer EML positioned below the second electrode CE may pass through the second electrode CE and be emitted toward an upper portion of the encapsulation layer TFE.

The encapsulation layer TFE may be provided and/or formed on an entire surface of the second electrode CE.

The encapsulation layer TFE may include a first insulating layer INS1, an organic insulating layer OINS, and a second insulating layer INS2 sequentially disposed on the second electrode CE. The first insulating layer INS1 may be positioned on the display element layer DPL (or the second electrode CE) and may be disposed on an entire surface of the display area DA.

The first insulating layer INS1 and the second insulating layer INS2 may be formed of an inorganic layer including an inorganic material, and the organic insulating layer OINS may be formed of an organic layer including an organic material.

Figure 5:
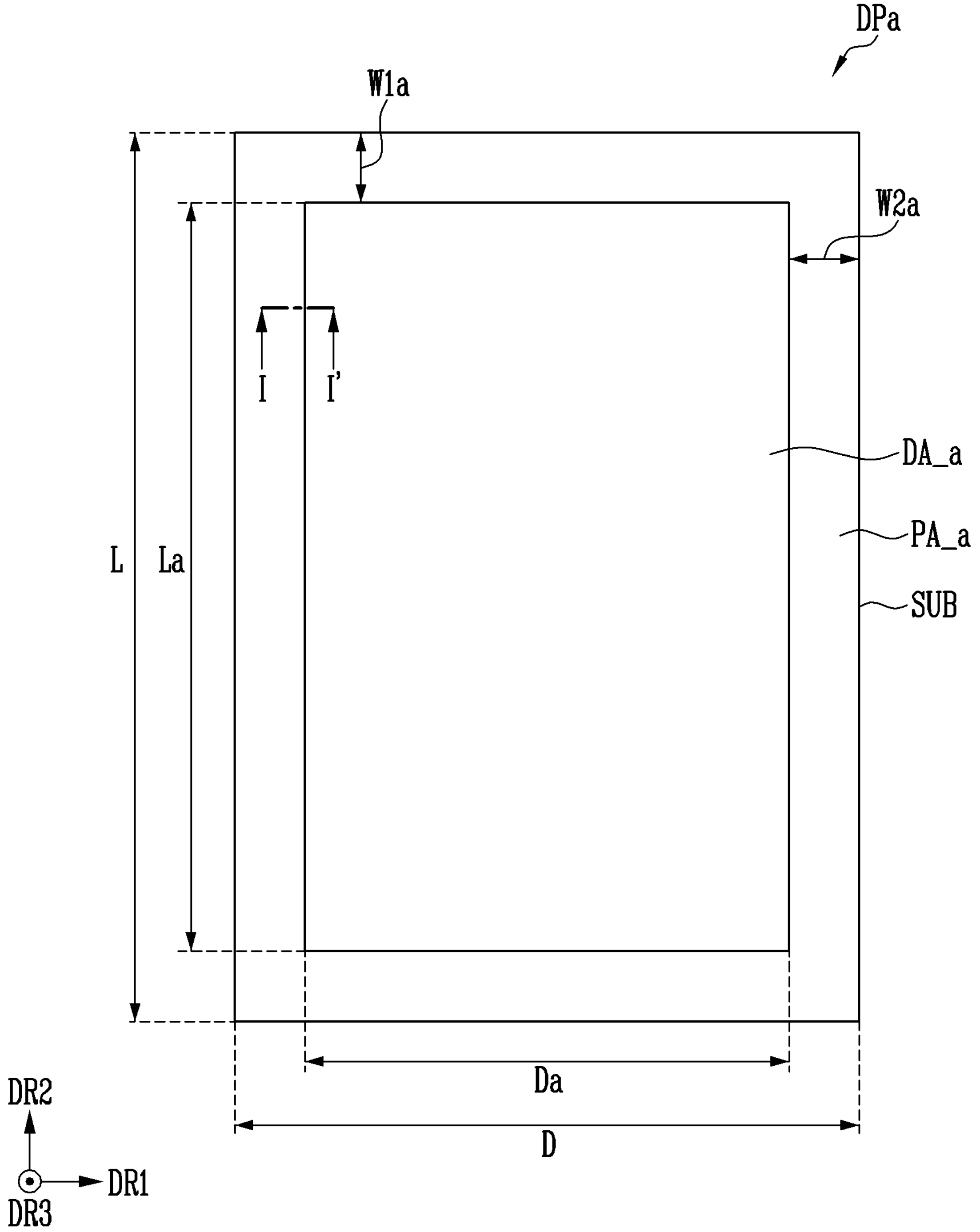
FIG. 5 is a plan view schematically illustrating the display panel of FIG. 1 having the display area having a first area.
Figure 6:
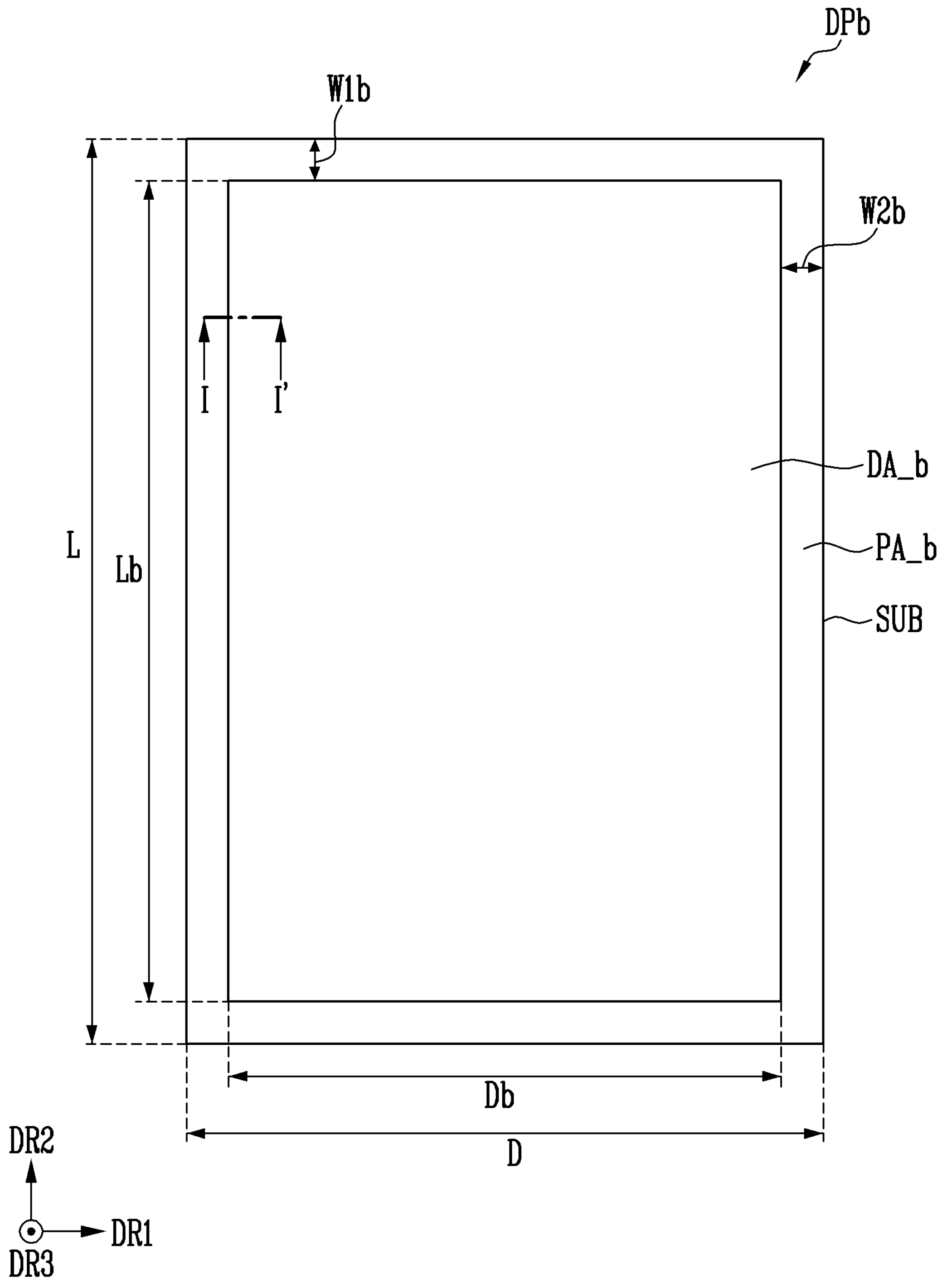
FIG. 6 is a plan view schematically illustrating the display panel of FIG. 1 having the display area having a second area.

FIG. 5 is a plan view schematically illustrating the display panel of FIG. 1 having the display area having a first area. FIG. 6 is a plan view schematically illustrating the display panel of FIG. 1 having the display area having a second area.

Referring to FIGS. 5 and 6, display panels DPa and DPb may have a first side having a first length L and a second side having a second length D extending in a direction perpendicular to the first side. A length of the first side of the display panel DPa may be equal to a length of the first side of the display panel DPb, and a length of the second side of the display panel DPa may be equal to a length of the second side of the display panel DPb. In an embodiment, the display panel DPa may include a first display area DA_a having a first area and a first peripheral area PA_a. The display panel DPb may include a second display area DA_b having a second area greater than the first area and a second peripheral area PA_b.

The sizes of the first and second display areas DA_a and DA_b constituting the display panels DPa and DPb and the sizes of the first and second peripheral areas PA_a and PA_b may be different from each other. For example, even in case that the display panels DPa and DPb have a same shape and area, the shape and/or area of each of the first and second display areas DA_a and DA_b and the first and second peripheral areas PA_a and PA_b may be different depending on a manufacturing process of the display device. For example, the resolution and dead space area of the display panels DPa and DPb may be set differently according to the sizes of the first and second display areas DA_a and DA_b and the first and second peripheral areas PA_a and PA_b.

Referring to FIG. 5, the display panel DPa may include the first display area DA_a and the first peripheral area PA_a. The first display area DA_a may have the first area. The first display area DA_a may have a first horizontal size Da in the first direction DR1 and a first vertical size La in the second direction DR2. The first peripheral area PA_a may have a first horizontal width W2*a* in the first direction DR1 and a first vertical width W1*a* in the second direction DR2.

Referring to FIG. 6, the display panel DPb may include the second display area DA_b and the second peripheral area PA_b. The second display area DA_b may have the second area greater than the first area of the first display area DA_a. The second display area DA_b may have a second horizontal size Db in the first direction DR1 and a second vertical size Lb in the second direction DR2. The second peripheral area PA_b may have a second horizontal width W2*b* in the first direction DR1 and a second vertical width W1*b* in the second direction DR2.

The first horizontal size Da of the first display area DA_a may be less than the second horizontal size Db of the second display area DA_b. The first vertical size La of the first display area DA_a may be less than the second vertical size Lb of the second display area DA_b. However, the disclosure is not limited thereto, and the first vertical size La may be greater than the second vertical size Lb.

The first horizontal width W2*a* of the first peripheral area PA_a may be greater than the second horizontal width W2*b* of the second peripheral area PA_b. In an embodiment, the first vertical width W1*a* of the first peripheral area PA_a may be greater than the second vertical width W1*b* of the second peripheral area PA_b. However, the disclosure is not limited thereto, and the first vertical width W1*a* may be less than the second vertical width W1*b*.

Figure 7:
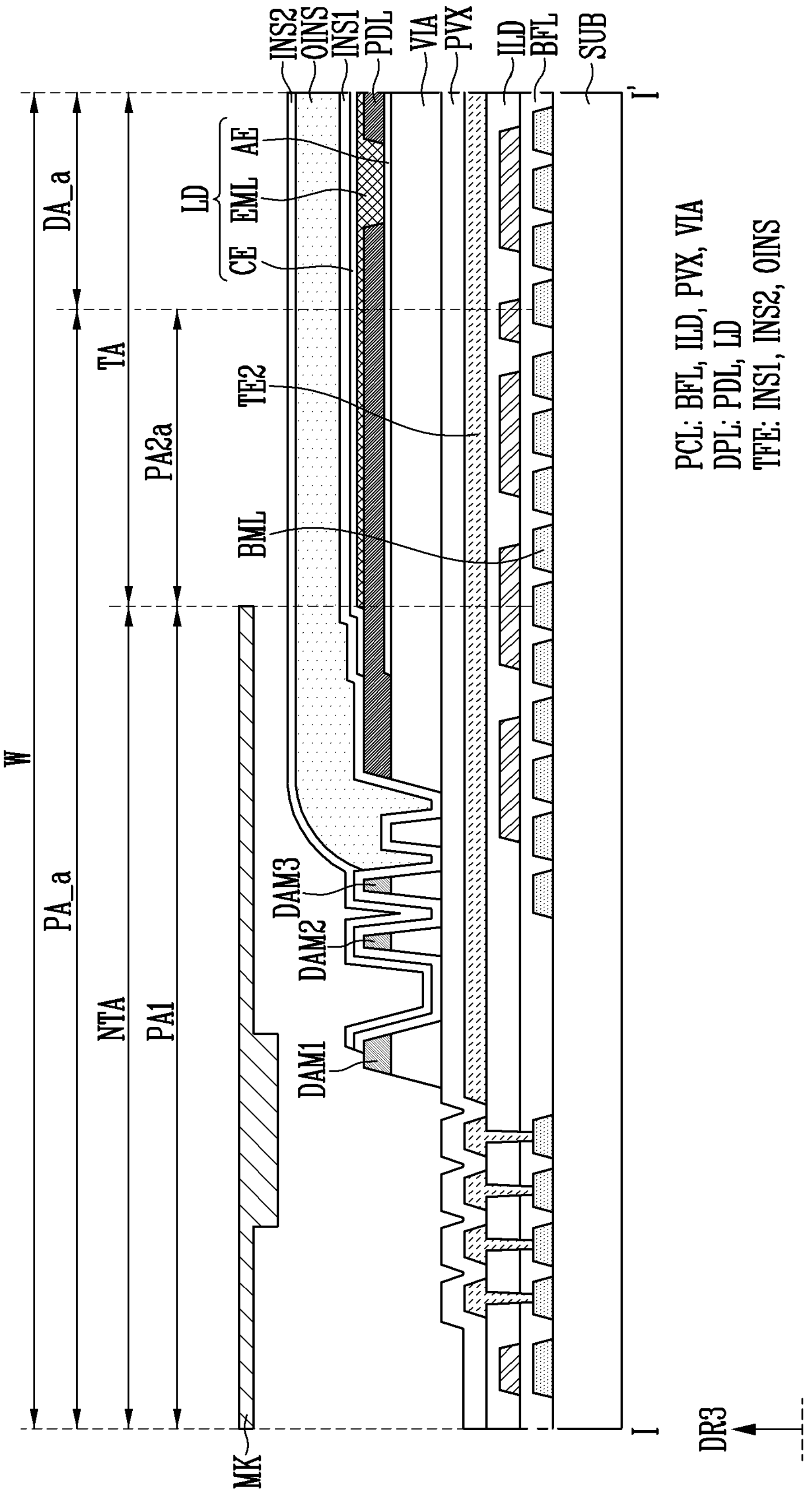
FIG. 7 is a schematic cross-sectional view taken along line I-I' in FIG. 5.
Figure 8:
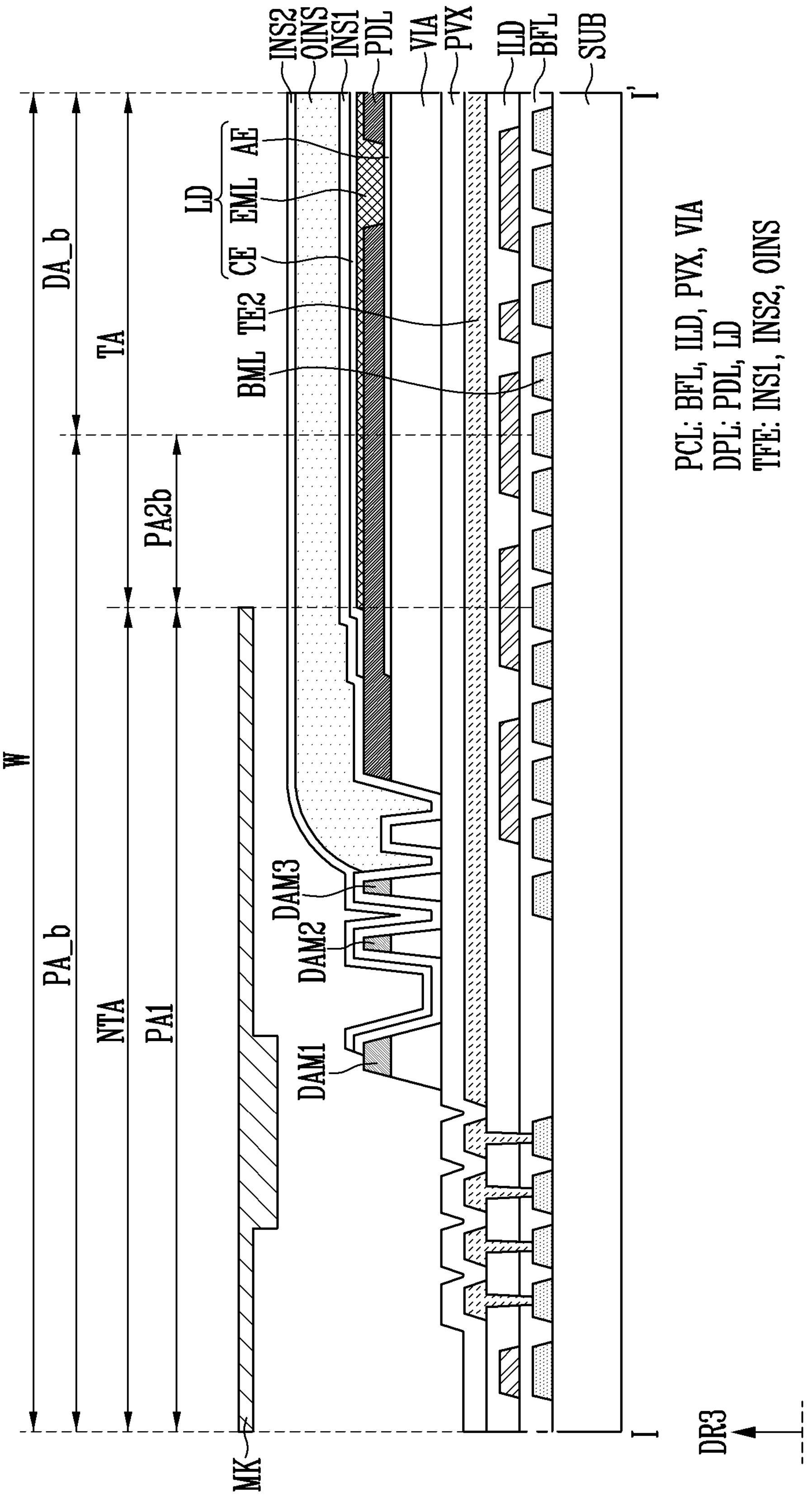
FIG. 8 is a schematic cross-sectional view taken along line I-I' in FIG. 6.

FIG. 7 is a schematic cross-sectional view taken along line I-I' in FIG. 5. FIG. 8 is a schematic cross-sectional view taken along line I-I' in FIG. 6.

FIG. 7 schematically shows the first peripheral area PA_a and a portion of the first display area DA_a constituting the display panel DPa including the first display area DA_a having the first area. FIG. 8 schematically shows the second peripheral area PA_b and a portion of the second display area DA_b constituting the display panel DPb including the second display area DA_b having the second area greater than the first area.

Referring to FIGS. 5, 6, 7, and 8, cross-sectional views taken along lines extending from the first and second display areas DA_a and DA_b to edges of the display panels DPa and DPb are shown. Left portions of the first and second peripheral areas PA_a and PA_b shown in the cross-sectional views may be portions adjacent to the edges of the display panels DPa and DPb.

Referring to FIGS. 7 and 8, widths W extending from the first and second peripheral areas PA_a and PA_b to the first and second display areas DA_a and DA_b along the line I-I' may be the equal.

Referring to FIGS. 7 and 8, some components disposed in the first and second display areas DA_a and DA_b may be extended and disposed in the first and second peripheral areas PA_a and PA_b. In an embodiment, the first and second peripheral areas PA_a and PA_b may include the buffer layer BFL, the interlayer insulating layer ILD, the passivation layer PVX, and the via layer VIA included in the pixel circuit layer PCL of the first and second display areas DA_a and DA_b, and the first and second peripheral areas PA_a and PA_b may include the pixel defining layer PDL, the first electrode AE, the second electrode CE, and the light emitting layer EML included in the display element layer DPL of the first and second display areas DA_a and DA_b. The first and second peripheral areas PA_a and PA_b may further include the first and second insulating layers INS1 and INS2 and the organic insulating layer OINS included in the encapsulation layer TFE of the first and second display areas DA_a and DA_b.

The buffer layer BFL, the interlayer insulating layer ILD, the passivation layer PVX, and the via layer VIA may be sequentially disposed on the substrate SUB in the third direction DR3. FIG. 4 shows that the buffer layer BFL, the interlayer insulating layer ILD, and the passivation layer PVX are sequentially disposed on the substrate SUB, but at least one of these layers may be omitted.

The first and second display areas DA_a and DA_b may be areas where light emitting elements LD are disposed and may be areas where light is emitted. In an embodiment, the first electrode AE, the light emitting layer EML, and the second electrode CE constituting the light emitting element LD may be sequentially disposed on the via layer VIA in the third direction DR3.

The first peripheral area PA_a may include a first area PA1 and a second area PA2*a*. The second peripheral area PA_b may include a first area PA1 and a second area PA2*b*. The first area PA1 may be an area in which the light emitting layer EML is not disposed. The second areas PA2*a* and PA2*b* may extend from the first and second display areas DA_a and DA_b and may be areas where the light emitting layer EML is disposed. In an embodiment, the second areas PA2*a* and PA2*b* may be areas in which the first electrode AE, the second electrode CE, and the light emitting layer EML overlap each other in a plan view.

A mask MK may be an open mask for depositing the light emitting layer EML. The mask MK may include a transmissive area TA and a non-transmissive area NTA. The transmissive area TA may be an opening area formed to deposit the light emitting layer EML. The non-transmissive area NTA may be a frame area for preventing the light emitting layer EML from being deposited. The mask MK may be a mask having the transmissive area TA having the smallest width among masks required in a manufacturing process of the display panels DPa and DPb.

The mask MK may be supported by a mask support DAM1 (or a first dam structure) in the first and second peripheral areas PA_a and PA_b. The mask supporter DAM1 may be disposed to be spaced apart from edges of the display panels DPa and DPb by a first distance (for example, a first distance D1 in FIG. 10). In an embodiment, the mask supporter DAM1 may be disposed at a position overlapping the first area PA1 in a plan view. The mask support DAM1 may have a shape protruding in the third direction DR3 on the passivation layer PVX. In an embodiment, the mask supporter DAM1 may be disposed to be spaced apart from the edges of the display panels DPa and DPb by a distance in the first area PA1 regardless of areas of the first and second display areas DA_a and DA_b (or lengths of the long and/or short sides of the first and second display areas DA_a and DA_b).

The mask MK may be supported by the mask support DAM1 to define the first area PA1 of the first and second peripheral areas PA_a and PA_b. The mask support DAM1, the via layer VIA, and the pixel defining layer PDL may be disposed on a same layer. The mask support DAM1 may be disposed to be spaced apart from the via layer VIA and the pixel defining layer PDL.

Second and third dam structures DAM2 and DAM2 may be disposed in a direction adjacent to the second areas PA2*a* and PA2*b* from the mask supporter DAM1. In an embodiment, the mask support DAM1 and the second and third dam structures DAM2 and DAM3 may have a same height in the third direction DR3, but the disclosure is not limited thereto. The height of the mask support DAM1 may be greater than the heights of the second and third dam structures DAM2 and DAM3. Although the second and third dam structures DAM2 and DAM3 are shown in FIG. 7, the disclosure is not limited thereto. The second and third dam structures DAM2 and DAM3 may be omitted.

The first area PA1 may be an area corresponding to the non-transmissive area NTA of the mask MK. For example, the first area PA1 may be an area in which the light emitting layer EML is not deposited.

The second areas PA2*a* and PA2*b* may be margin areas for securing the display areas DA_a and DA_b, which are areas in which light emitting elements LD are disposed. First electrodes AE disposed in the second areas PA2*a* and PA2*b* may be disposed between the pixel defining layer PDL and the via layer VIA. The light emitting layer EML and the second electrode CE disposed in the second areas PA2*a* and PA2*b* may be disposed on the pixel defining layer PDL. The light emitting layer EML disposed in the second areas PA2*a* and PA2*b* may be covered by the second electrode CE.

The first and second peripheral areas PA_a and PA_b may include first and second insulating layers INS1 and INS2 and an organic insulating layer OINS extending from the first and second display areas DA_a and DA_b. The first insulating layer INS1, the organic insulating layer OINS, and the second insulating layer INS2 may be sequentially disposed on the passivation layer PVX and the second electrode CE disposed in the second areas PA2*a* and PA2*b* in the third direction DR3.

At least a portion of the mask support DAM1 disposed in the first area PA1 may be covered by the first and second insulating layers INS1 and INS2, but the disclosure is not limited thereto. The mask support DAM1 may be entirely covered by the first and second insulating layers INS1 and INS2.

The mask MK may be equally used in the manufacturing process of the display panels DPa and DPb. For example, in the manufacturing process of the display panels DPa and DPb, the amount and/or length of the light emitting layer EML provided and/or formed on the display panels DPa and DPb may be the same by applying the mask MK having the non-transmissive area NTA and the transmissive area TA.

In the display panels DPa and DPb, widths (or sizes) of the first area PA1 of the first and second peripheral areas PA_a and PA_B may be the same, but a width of the second area PA2*a* of the display panel DPa and a width of the second area PA2*b* of the display panel DPb may be different from each other.

The sizes of the display panels DPa and DPb may be the same, but the size of the second display area DA_b of the display panel DPb may be greater than the size of the first display area DA_a of the display panel DPa. A width of the second area PA2*a* of the first peripheral area PA_a of the display panel DPa may be greater than a width of the second area PA2*b* of the second peripheral area PA_b of the display panel DPb. For example, an area of the second area PA2*b*, which is the margin area of the display panel DPb, may be less than an area of the second area PA2*a* of the display panel DPa.

In a manufacturing method of a display device according to embodiments of the disclosure, display areas and peripheral areas of display panels may be set according to a size of a display area and the non-transmissive area NTA of the mask MK. In an embodiment, the second display area DA_b and the second peripheral area PA_b may be set in consideration of the size (for example, the second area) of the second display area DA_b and the size of the non-transmissive area NTA of the mask MK. In an embodiment, the first display area DA_a and the first peripheral area PA_a may be set in consideration of the size (for example, the first area) of the first display area DA_a and the size of the non-transmissive area NTA of the mask MK. According to the manufacturing method of the display device according to embodiments of the disclosure, in the manufacturing process of the display panels DPa and DPb, the mask MK may be equally used regardless of the sizes of the first and second display areas DA_a and DA_b. Therefore, the mask MK may be shared in the manufacturing process of the display panels DPa and DPb. Accordingly, the cost of replacing a mask according to a change in process conditions may be reduced. Since the mask MK is shared in the manufacturing process of the display panels DPa and DPb, a separate mask replacement process is not required, and thus process steps may be simplified.

FIGS. 9 to 16 are schematic cross-sectional views illustrating a manufacturing method of a display device according to embodiments of the disclosure.

Figure 9:
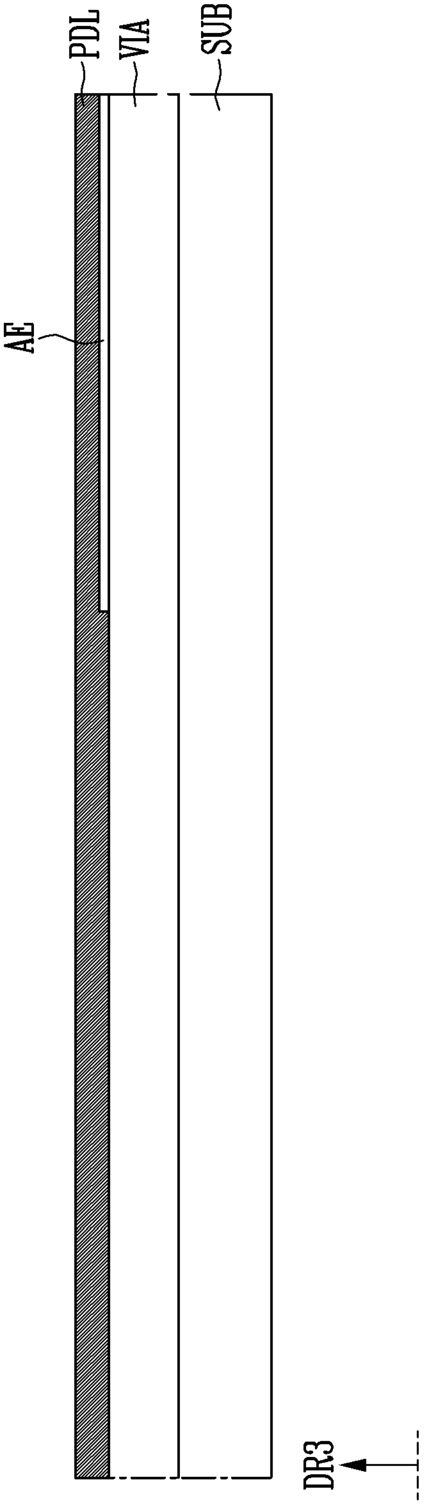
FIGS. 9 to 16 are schematic cross-sectional views illustrating a manufacturing method of a display device according to embodiments of the disclosure.

Referring to FIG. 9, a substrate SUB, a via layer VIA, and a pixel defining layer PDL may be sequentially formed in a third direction DR3. In an embodiment, a first electrode AE may be formed between the via layer VIA and the pixel defining layer PDL. FIG. 9 schematically shows an embodiment in which the first electrode AE is formed only on a right upper surface of the via layer VIA, but the disclosure is not limited thereto. The first electrode AE may be disposed on an entire surface of the via layer VIA.

Figure 10:
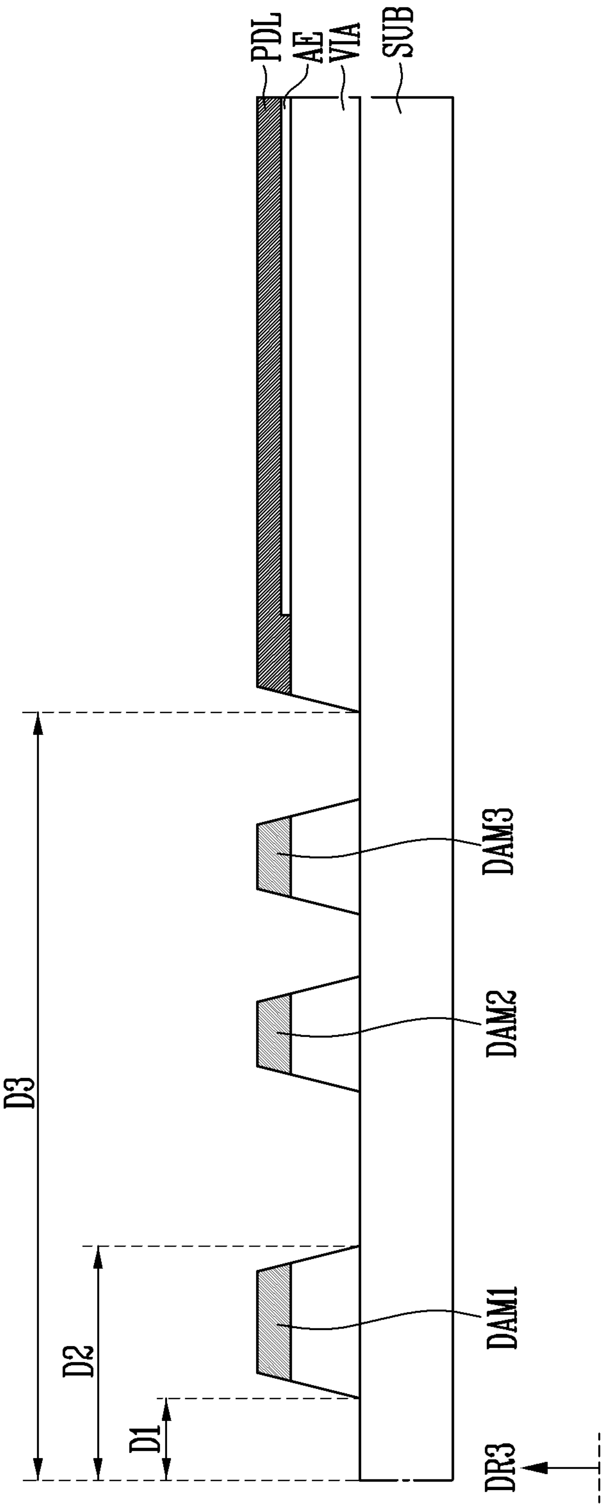

Referring to FIG. 10, a mask support DAM1 and second and third dam structures DAM2 and DAM3 may be formed by removing portions of the via layer VIA and the pixel defining layer PDL. The mask support DAM1 may be formed by removing the via layer VIA and the pixel defining layer PDL disposed in an area spaced apart from the left side of the substrate SUB (or the edge of the substrate) by a first distance D1, and removing the via layer VIA and the pixel defining layer PDL disposed between a second distance D2 and a third distance D3 from the left side of the substrate SUB. In an embodiment, the second and third dam structures DAM2 and DAM3 may be formed by removing an area other than portions of the via layer VIA and the pixel defining layer PDL disposed between the second distance D2 and the third distance D3 from the left side of the substrate SUB.

In an embodiment, the mask support DAM1 may have a dam structure protruding in the third direction DR3. In an embodiment, a length of the mask support DAM1 and the second and third dam structures DAM2 and DAM3 protruding in the third direction DR3 may be substantially the same, but the disclosure is not limited thereto. As a portion of the pixel definition layer PDL forming the second and third dam structures DAM2 and DAM3 is etched, the height of the mask support DAM1 may be greater than the heights of the second and third dam structures DAM2 and DAM3.

Figure 11:
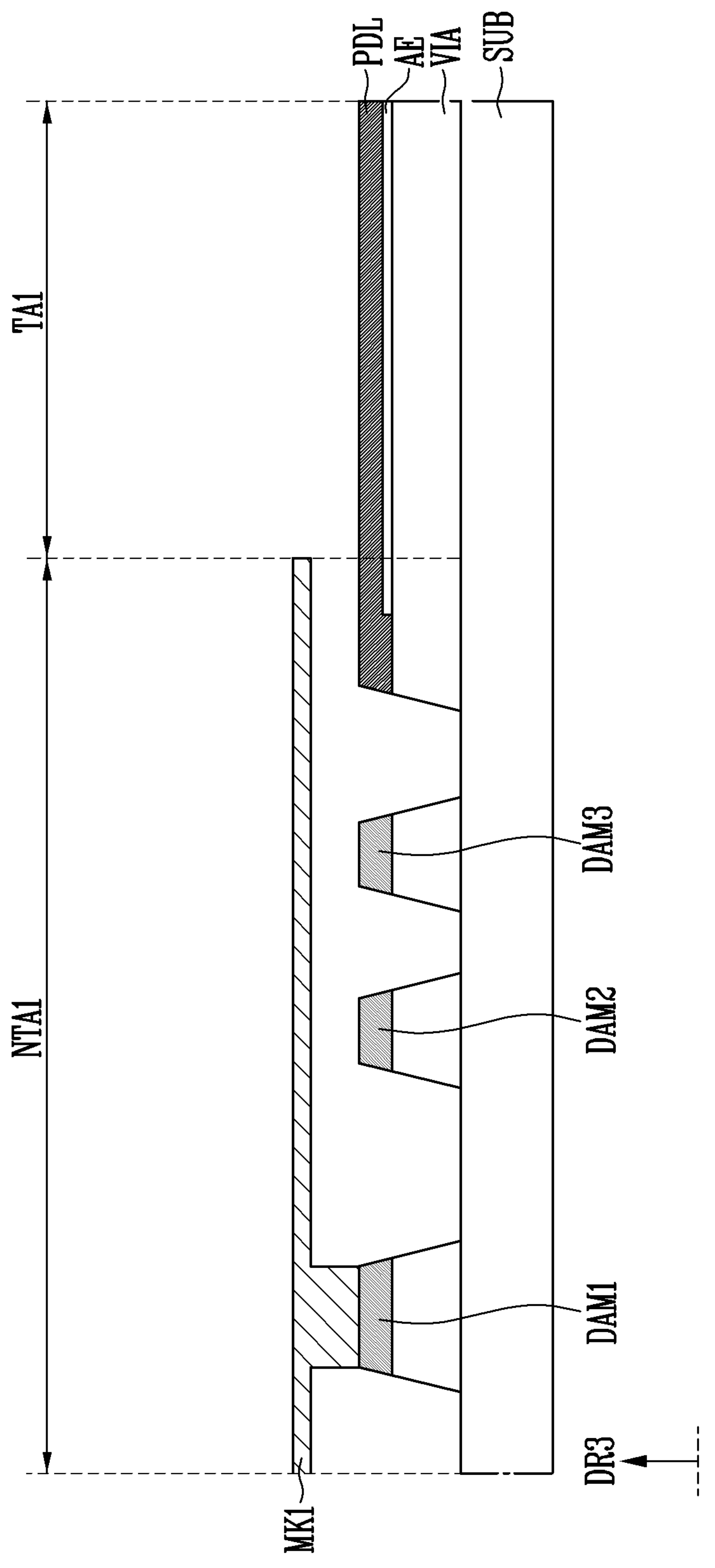

Referring to FIG. 11, a first mask MK1 may be disposed on the mask support DAM1. The first mask MK1 may include a first transmissive area TA1 and a first non-transmissive area NTA1. The first mask MK1 may be an open mask for depositing a light emitting layer (for example, the light emitting layer EML of FIG. 13).

Figure 12:
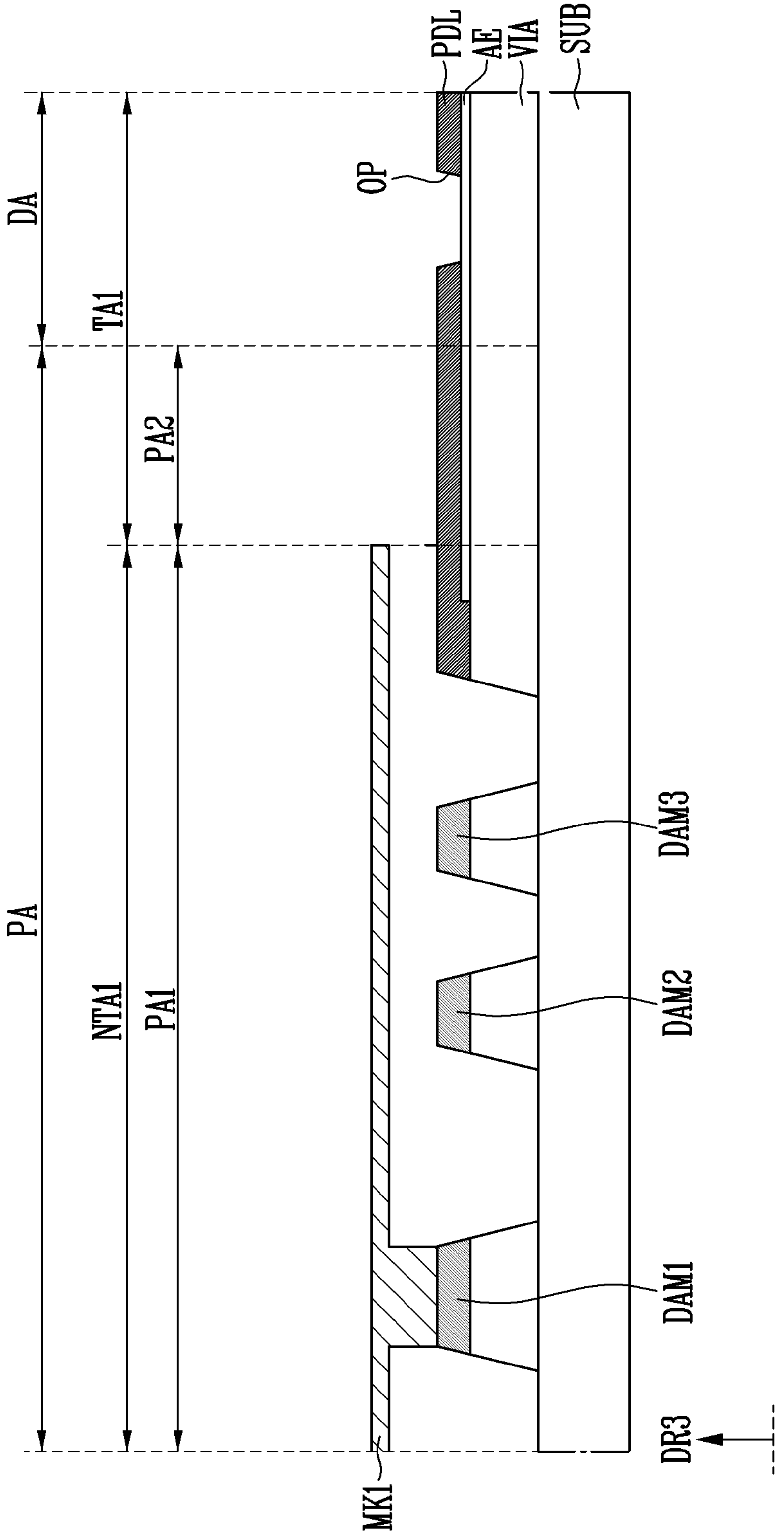

Referring to FIG. 12, a display area DA and a peripheral area PA positioned on a side of the display area DA may be determined in consideration of a size of the display area DA and/or a width of a non-transmissive area NTA.

Regardless of the size of the display area DA, the first mask MK1 including the first transmissive area TA1 and the first non-transmissive area NTA1 may be disposed on a first dam structure DAM1.

As the size of the display area DA increases, the width of the second area PA2 of the peripheral area PA may decrease. For example, as the size of the display area DA increases, in a plan view, the second area PA2 of the peripheral area PA overlapping the first transmissive area TA1 of the first mask MK1 may decrease, and the display area DA overlapping the first transmissive area TA1 of the first mask MK1 may increase (refer to FIG. 7).

As the size of the display area DA decreases, the width of the second area PA2 of the peripheral area PA may increase. For example, as the size of the display area DA decreases, in a plan view, the second area PA2 of the peripheral area PA overlapping the first transmissive area TA1 of the first mask MK1 may increase, and the display area DA overlapping the first transmissive area TA1 of the first mask MK1 may decrease (refer to FIG. 8).

After the display area DA and the peripheral area PA are determined, an opening OP for disposing a light emitting element (for example, the light emitting element LD of FIG. 4) of the display area DA may be formed in the pixel defining layer PDL.

In a manufacturing process of a display device DD, since the first mask MK1 may be shared and disposed regardless of the size of the display area DA and the size of the peripheral area PA, the cost of replacing a mask according to a change in process conditions, such as a change in the size of the display area DA and/or the peripheral area PA, may be reduced. In the manufacturing process of the display device DD, since a mask replacement process according to a change in process conditions is not required, process steps may be further simplified.

Figure 13:
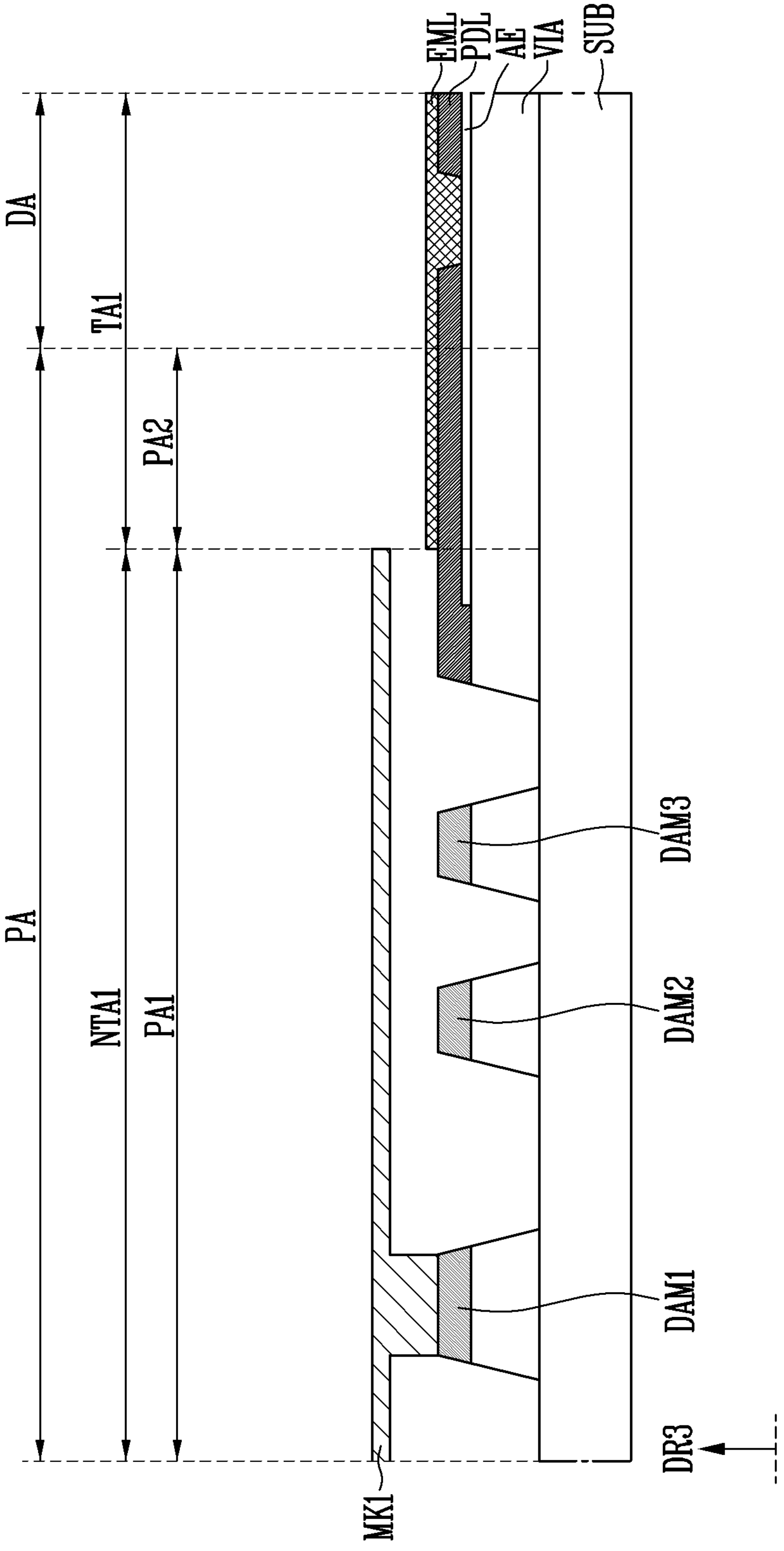

Referring to FIG. 13, the light emitting layer EML may be formed in the display area DA corresponding to the first transmissive area TA1 of the first mask MK1 and in the second area PA2 of the peripheral area PA.

The light emitting layer EML may have a multilayer thin film structure including a light generation layer. The light emitting layer EML may include a hole injection layer for injecting holes, a hole transport layer having excellent hole transport properties and suppressing the movement of electrons that are not combined in the light generation layer to increase the chance of recombination of holes and electrons, the light generation layer that emits light by recombination of injected electrons and holes, a hole blocking layer for suppressing the movement of holes that are not combined in the light generation layer, an electron transport layer for smoothly transporting electrons to the light generation layer, and an electron injection layer for injecting electrons.

The first mask MK1 may be removed after the light emitting layer EML is formed.

Figure 14:
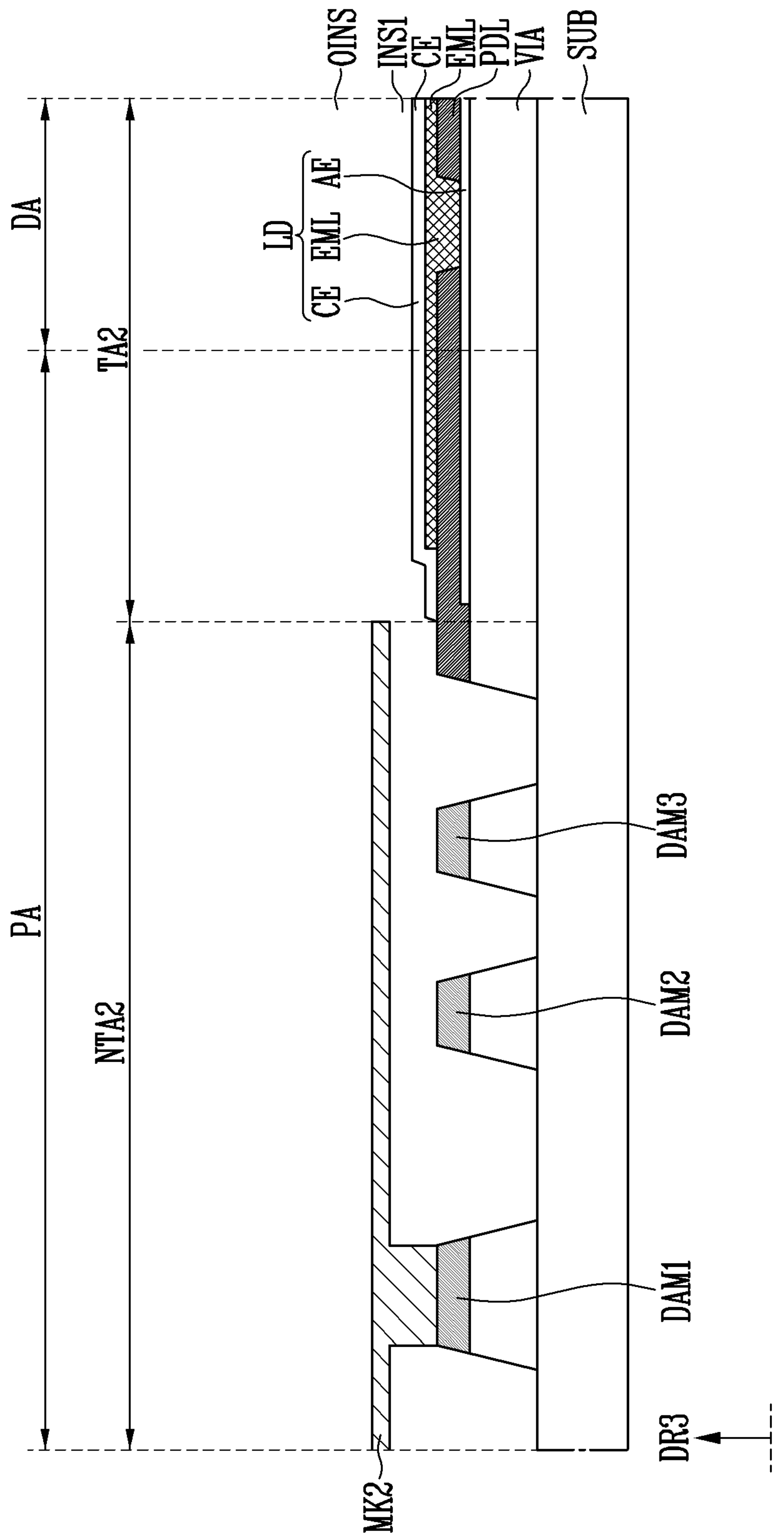

Referring to FIG. 14, a second mask MK2 may be disposed on the mask support DAM1. In an embodiment, the second mask MK2 may be an open mask for forming the second electrode CE. The second mask MK2 may include a second transmissive area TA2 and a second non-transmissive area NTA2. The size of the second transmissive area TA2 may be greater than the size of the first transmissive area TA1 of the first mask MK1. The size of the second non-transmissive area NTA2 may be less than the size of the first non-transmissive area NTA1 of the first mask MK1.

The second electrode CE may be formed in the display area DA corresponding to the second transmissive area TA2 of the second mask MK2 and a portion of the peripheral area PA. The second mask MK2 may be removed after the second electrode CE is formed.

Figure 15:
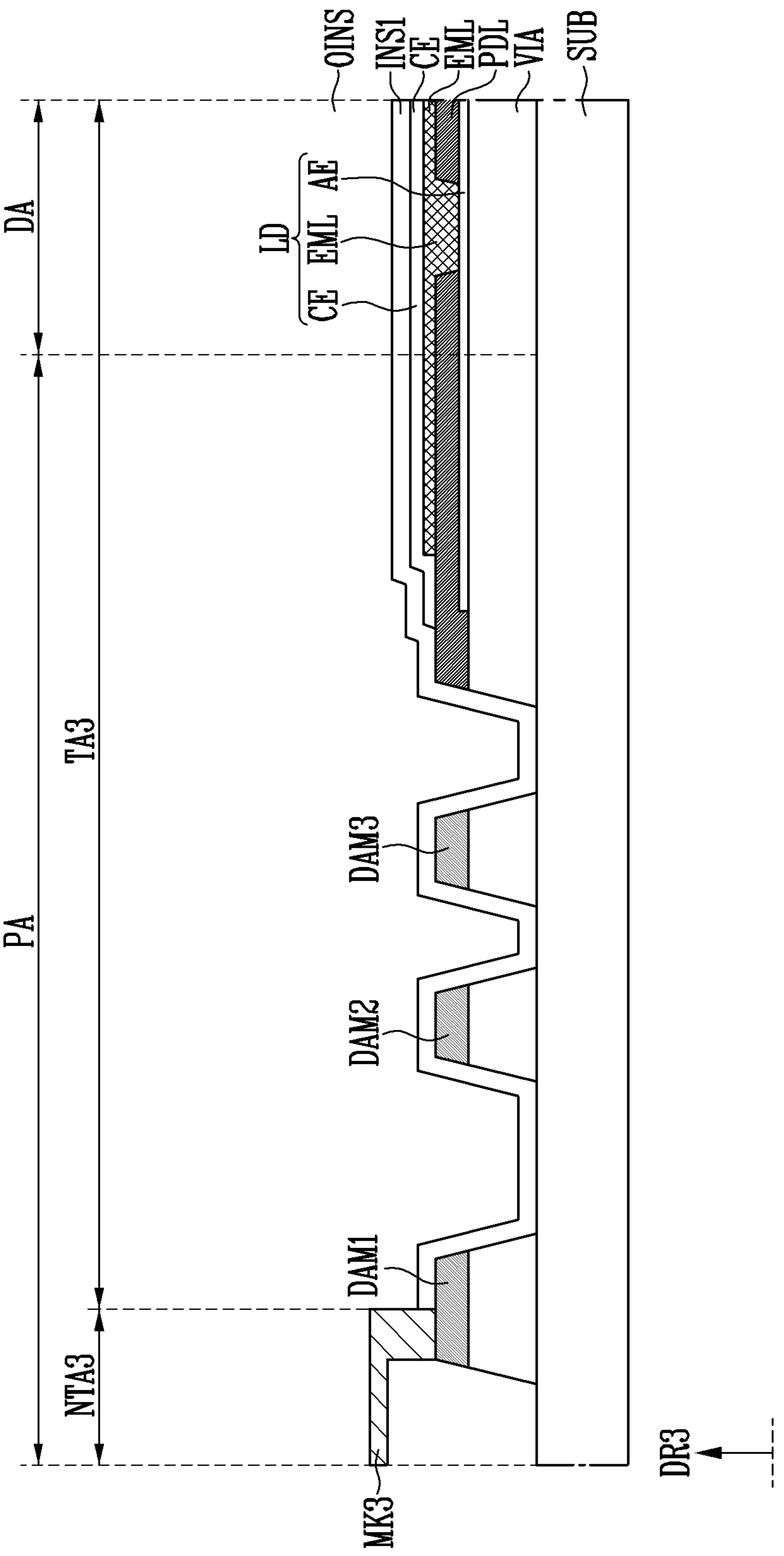

Referring to FIG. 15, a third mask MK3 may be disposed on the mask support DAM1. In an embodiment, the third mask MK3 may be an open mask for forming a first insulating layer INS1 (and/or the second insulating layer INS2 of FIG. 4). The third mask MK3 may include a third transmissive area TA3 and a third non-transmissive area NTA3. The size of the third transmissive area TA3 may be greater than the size of the second transmission area TA2 of the second mask MK2. The size of the third non-transmissive area NTA3 may be less than the size of the second non-transmissive area NTA2 of the second mask MK2.

The first insulating layer INS1 (and/or the second insulating layer INS2) may be formed in the display area DA corresponding to the third transmissive area TA3 of the third mask MK3 and a portion of the peripheral area PA. In an embodiment, the first insulating layer INS1 (and/or the second insulating layer INS2) may be entirely coated on a portion of the mask support DAM1, the second and third dam structures DAM2 and DAM3, the pixel defining layer PDL, and the second electrode CE. The third mask MK3 may be removed after the first insulating layer INS1 (and/or the second insulating layer INS2) is formed.

Figure 16:
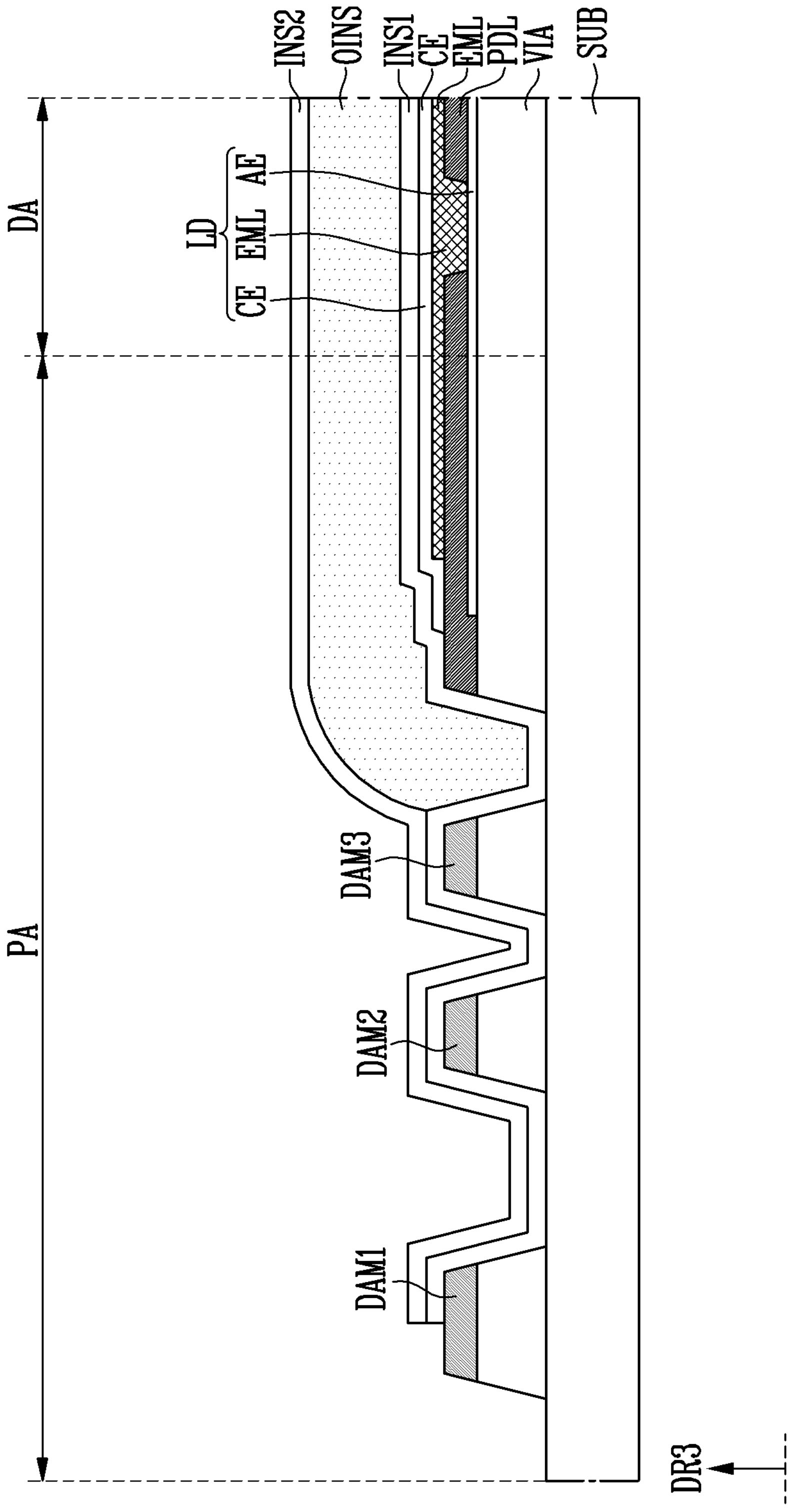

Referring to FIG. 16, after the first insulating layer INS1 is formed, an organic insulating layer OINS and the second insulating layer INS2 may be sequentially formed. After the organic insulating layer OINS is formed, end portions of the organic insulating layer OINS may be completely covered by the second insulating layer INS2 so as not to be exposed to outside. In an embodiment, the first and second insulating layers INS1 and INS2 may include an inorganic material, and the organic insulating layer OINS may include an organic material. The first and second insulating layers INS1 and INS2 and the organic insulating layer OINS may be disposed to extend to the peripheral area PA outside the display area DA in order to prevent moisture or oxygen from entering the light emitting element LD.

According to the display device and the manufacturing method thereof according to the embodiments of the disclosure, an area (for example, a non-transmissive area) where a mask is disposed may be secured within a peripheral area surrounding a display area, and thus the mask may be shared regardless of the size of the display area in a manufacturing process of the display device.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A manufacturing method of a display device comprising:

forming a mask support spaced apart from an edge of a substrate by a first distance;

disposing a mask including a transmissive area and a non-transmissive area surrounding the transmissive area on the mask support;

determining a display area and a peripheral area positioned at a side of the display area based on at least one of a size of the display area and a width of the non-transmissive area; and forming a light emitting layer in the display area corresponding to the transmissive area and a portion of the peripheral area using the mask.

2. The manufacturing method of claim 1, wherein in a plan view, the peripheral area of the substrate includes a first area overlapping the non-transmissive area and a second area overlapping the transmissive area, and the light emitting layer is not formed in the first area.

3. The manufacturing method of claim 2, wherein in the determining of the display area and the peripheral area, the second area of the peripheral area is set smaller as the width of the non-transmissive area increases.

4. The manufacturing method of claim 2, wherein in the determining of the display area and the peripheral area, a size of the second area of the peripheral area is set smaller as the size of the display area increases.

5. The manufacturing method of claim 2, wherein in the determining of the display area and the peripheral area, the size of the display area and the second area of the peripheral area are in inverse proportion to each other.

6. The manufacturing method of claim 2, wherein the first area of the peripheral area is determined based on the width of the non-transmissive area of the mask.

7. The manufacturing method of claim 2, wherein the first area of the peripheral area has a fixed size regardless of the size of the display area.

8. The manufacturing method of claim 2, wherein in a plan view, the mask support overlaps the first area of the peripheral area.

9. The manufacturing method of claim 2, wherein the forming of the mask support includes:

forming a first dam structure spaced apart from the edge of the substrate by the first distance and protruding in a direction.

10. The manufacturing method of claim 9, wherein the forming of the first dam structure includes:

forming a via layer and a pixel defining layer in the peripheral area; and forming the first dam structure by removing portions of the via layer and the pixel defining layer.

11. The manufacturing method of claim 10, further comprising:

forming a second dam structure spaced apart from the first dam structure in a first direction by removing another portions of the via layer and the pixel defining layer.

12. The manufacturing method of claim 11, wherein in a plan view, the first dam structure and the second dam structure overlap the first area of the peripheral area.

13. The manufacturing method of claim 11, further comprising:

forming an insulating layer covering the first dam structure and the second dam structure.

14. The manufacturing method of claim 2, wherein the mask support is disposed spaced apart from the substrate by the first distance within the peripheral area regardless of the size of the display area.

15. The manufacturing method of claim 1, wherein in a plan view, the peripheral area includes a first area overlapping the non-transmissive area and a second area overlapping the transmissive area, the second area of the peripheral area does not overlap the non-transmissive area, and the first area of the peripheral area does not overlap the transmissive area.

16. A display device comprising:

a substrate including a display area including a light emitting element and a peripheral area positioned on a side of the display area;

a mask support disposed on the substrate spaced apart from the substrate by a first distance in the peripheral area;

a via layer disposed on the substrate spaced apart from the mask support; and a first electrode, a light emitting layer, and a second electrode sequentially disposed on the via layer in a direction in portions of the display area and the peripheral area, wherein the first electrode and the second electrode disposed in the display area directly contact the light emitting layer, a pixel defining layer is disposed between the first electrode and the light emitting layer disposed in the peripheral area, and the display area and the peripheral area are determined based on a size of the display area and a width of the light emitting layer.

17. The display device of claim 16, wherein the peripheral area includes a first area where the light emitting layer is not disposed and a second area where the light emitting layer is disposed, and the size of the display area and a size of the second area of the peripheral area are in inverse proportion to each other.

18. The display device of claim 17, wherein the mask support is disposed spaced apart from the substrate by the first distance within the first area regardless of the size of the display area.

19. The display device of claim 18, wherein the mask support has a dam structure protruding in the direction.

* * * * *